United States Patent [19]

Kosugi et al.

[11] Patent Number: 4,745,381
[45] Date of Patent: May 17, 1988

[54] MICROWAVE CONNECTOR ASSEMBLY CAPABLE OF BEING READILY CONNECTED TO MICROWAVE CIRCUIT COMPONENTS

[75] Inventors: Yuhei Kosugi; Hirohisa Ozawa; Hideki Kusamitsu; Yoshio Minowa, all of Tokyo, Japan

[73] Assignee: NEC Corporation, Japan

[21] Appl. No.: 918,547

[22] Filed: Oct. 10, 1986

[30] Foreign Application Priority Data

Oct. 14, 1985 [JP] Japan ............................. 60-228375
May 2, 1986 [JP] Japan ............................. 61-102621
Jun. 30, 1986 [JP] Japan ............................. 61-151715

[51] Int. Cl.$^4$ ............................................. H01P 5/00
[52] U.S. Cl. ................................... 333/245; 333/246; 333/260; 439/281
[58] Field of Search ............... 333/33, 245, 246, 247, 333/260; 339/255 R; 361/399, 400, 404, 405; 439/581, 582

[56] References Cited

U.S. PATENT DOCUMENTS

| | | | |
|---|---|---|---|
| 3,155,881 | 11/1964 | St. Jean | 333/247 X |
| 4,455,537 | 6/1984 | Le Prade et al. | 333/246 X |
| 4,494,095 | 1/1985 | Noji et al. | 361/399 X |
| 4,595,893 | 6/1986 | Charbonnier et al. | 333/246 |

FOREIGN PATENT DOCUMENTS 64503  4/1985  Japan .................................. 333/247

Primary Examiner—Paul Gensler
Attorney, Agent, or Firm—Laff, Whitesel, Conte & Saret

[57] ABSTRACT

In a microwave connector assembly for electrical connection of adjacent ones of microwave circuit components, an internal conductor is accommodated in a cavity formed by an external conductor member and is supported by an insulator support member within the cavity. The internal conductor is operable as a leaf spring and elastically brought into contact with a pair of contacts fixed to radio frequency terminals of the adjacent microwave circuit components. The external conductor member may be formed either by a base plate for mounting the circuit components or by a conductive case which is covered with a conductive cap and which is located in an opening of the base plate. A print board may mechanically be attached to the base plate so as to supply a bias voltage to each circuit component through bias terminals thereof.

14 Claims, 12 Drawing Sheets

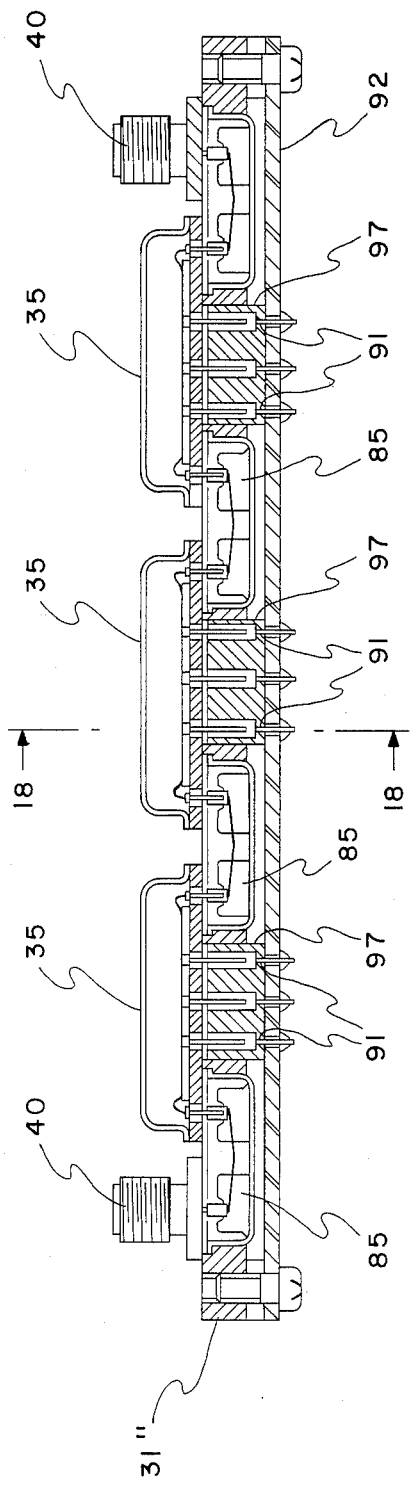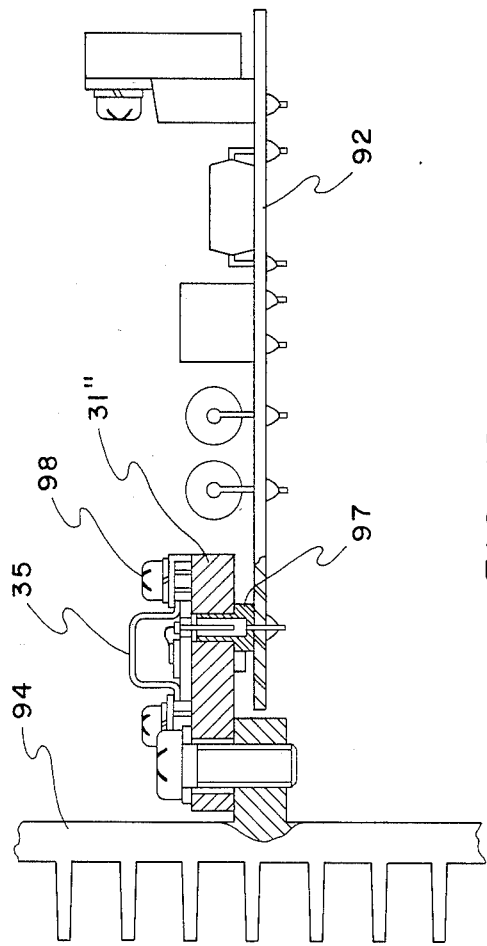
FIG. 17
FIG. 18

MICROWAVE CONNECTOR ASSEMBLY CAPABLE OF BEING READILY CONNECTED TO MICROWAVE CIRCUIT COMPONENTS

BACKGROUND OF THE INVENTION

This invention relates to a microwave connector assembly for use in electrical connection of microwave circuit components and to a microwave circuit arrangement comprising the microwave circuit components connected by a microwave connector assembly of the type described.

In Japanese Patent Publication No. Syo 59-10,601, namely, 10,601/1984, a conventional microwave circuit arrangement is disclosed which comprises a conductive base plate having a pair of principal surfaces and a plurality of microwave circuit components mounted on one of the principal surfaces. The microwave circuit components and the conductive base plate are accommodated in a conductive housing electrically connected to the conductive base plate so as to electromagnetically shield the microwave circuit components and to reduce occurrence of an undesired wave. Such microwave circuit components are implemented as a microwave integrated circuit (MIC) which may be either a hybrid integrated circuit (HIC) or a monolithic microwave integrated circuit (MMIC).

More particularly, each of the microwave circuit components has a plurality of radio frequency (RF) terminals for receiving and transmitting a microwave signal. On manufacturing a transmitter or a receiver, each of the microwave circuit components should electrically and mutually be connected to an adjacent one of the microwave circuit components through the radio frequency terminals.

For this purpose, a strip line circuit is laid on the other principal surface opposite to the above-mentioned one principal surface and each radio frequency terminal is electrically connected to the strip line circuit through a through hole. In this event, the radio frequency terminals are led to the other principal surface through the through holes and soldered to the strip line circuit in the conventional microwave circuit arrangement.

However, it is very troublesome to assemble the above-mentioned circuit arrangement because the base plate must be subjected to any processing on both sides thereof.

In addition, soldering should be carried out in a restricted space by the use of a soldering gun and is therefore very time-consuming. An amount of solder is susceptible to variation in the soldering. Such variation of the amount of solder results in an electrical discontinuity of a microwave transmission line which is formed through the microstrip line, the radio frequency terminals, and the microwave circuit components. This gives rise to variation of characteristics in the microwave transmission line.

Moreover, another electrical discontinuity inevitably takes place at points of connection between the microstrip line and the radio frequency terminals and brings about serious mismatches of impedance with an increase of a frequency of the microwave.

Furthermore, use of the microstrip line makes the conductive housing inevitably bulky because the microstrip line must comparatively become long. Such a bulky housing often causes undesired mode excitation to occur therein and might induce undesired coupling to any other circuits.

It may be mentioned here that a microwave circuit arrangement of the above-mentioned type comprises a high frequency part, such as the microwave circuit components and the microstrip line, operable in a microwave frequency band of, for example, 2 GHz and a low frequency part, such as a bias circuit and an intermediate frequency converter, operable in a frequency band lower than the microwave frequency band.

In the above-referenced microwave circuit arrangement, no consideration is paid to separation of the low frequency part from the high frequency part. Accordingly, the microwave partially leaks from the high frequency part into the low frequency part, which might give rise to objectionable interference and undesired coupling between the high and the low frequency parts.

SUMMARY OF THE INVENTION

It is therefore an object of this invention to provide a microwave connector assembly which is capable of being readily assembled when the connector assembly is electrically connected to radio frequency terminals of microwave circuit components.

It is another object of this invention to provide a microwave connector assembly of the type described, which can make soldering process useless on electrical connecting the connector assembly to the radio frequency terminals.

It is still another object of this invention to provide a microwave connector assembly of the type described, which is capable of reducing electrical discontinuities on the electrical connection of the connector assembly to the radio frequency terminals.

It is yet another object of this invention to provide a microwave connector assembly of the type described, which makes a housing small in size.

It is further object of this invention to provide a microwave circuit arrangement which can avoid leakage of a microwave during transmission of the microwave through the circuit arrangement.

It is another object of this invention to provide a microwave circuit arrangement wherein no interference or undesired coupling takes place between a part operable in a microwave frequency band and another part operable in a frequency band lower than the microwave frequency band.

A microwave connector assembly to which this invention is applicable is for use in electrical connection between terminals of microwave circuit components. According to this invention, the microwave connector assembly comprises an internal conductor which is operable as a leaf spring and which has a conductor axis extended along a predetermined direction, a center area transversely of the conductor axis, and a pair of end areas on both sides of the center area along the conductor axis, an insulator support member for supporting the internal conductor at the center area, a pair of contacts to be urged towards the terminals by the internal conductor with the contacts brought into contact with the end areas of the internal conductor, respectively, and an external conductor member having bottom and wall surfaces which define a cavity for accommodating the internal conductor, the insulator support member, and the contact pair with the insulator support member attached to the bottom surface.

BRIEF DESCRIPTION OF THE DRAWING

FIG. 17 shows a similar view of a microwave circuit arrangement according to a sixth embodiment of this invention;

FIG. 18 shows a side view of the microwave circuit arrangement illustrated in FIG. 17 with a part of the circuit arrangement cut away;

DESCRIPTION OF THE PREFERRED EMBODIMENTS

Figure 1:
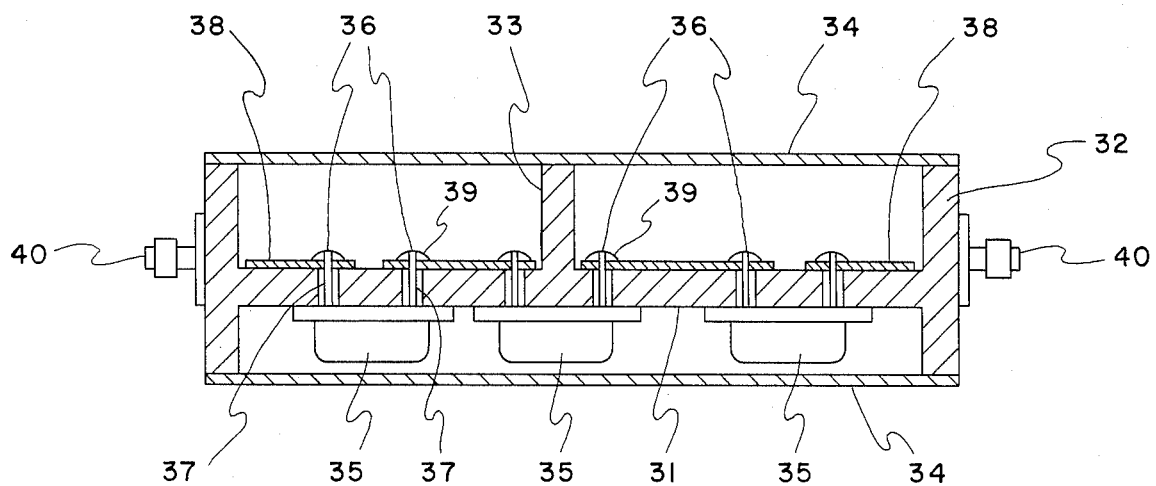
FIG. 1 shows a sectional view of a conventional microwave circuit arrangement.
Figure 2:
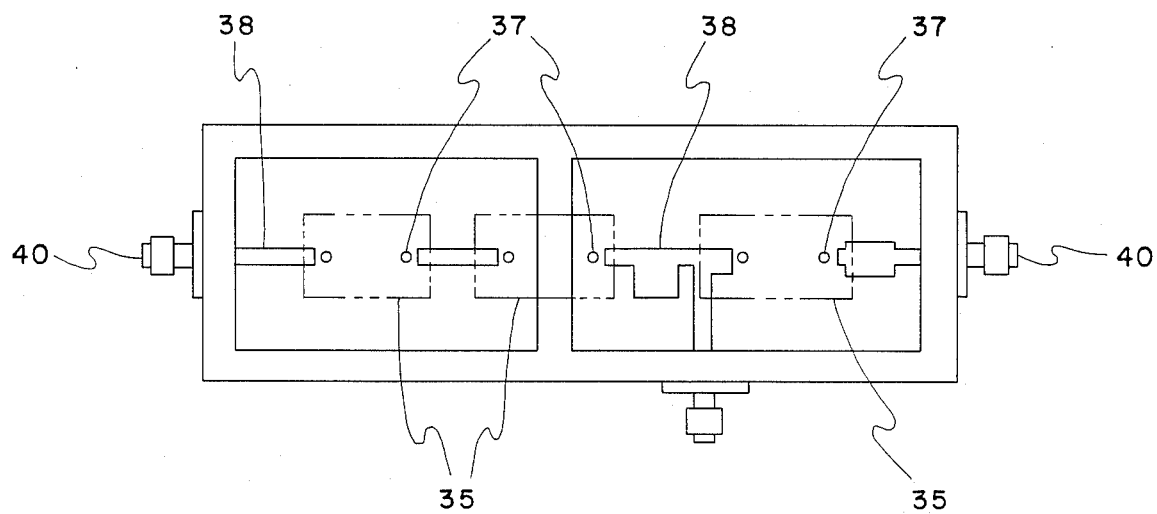
FIG. 2 shows a plan view of the conventional microwave circuit arrangement with conductive covers removed.

Referring to FIGS. 1 and 2, description will be made as regards a conventional microwave circuit arrangement which is substantially equivalent to that described in the above-referenced Japanese Patent Publication. The illustrated microwave circuit arrangement comprises a base plate 31 which has a first principal surface directed downwards of FIG. 1 and a second principal surface directed upwards thereof. The conductive housing comprises a wall member 32 extended downwards and upwards of the base plate 31 and united with the base plate 31 at a periphery thereof. Consequently, the conductive housing has an inner space divided by the base plate 31 into an upper and a lower room. The base plate 31 may therefore be called a partition. The upper room is partitioned into two partial rooms by a shield wall 33 standing upright from the second principal surface. As shown in FIG. 1, conductive covers 34 are attached to the wall member 32 on both sides thereof.

A plurality of microwave circuit components which are collectively depicted at 35 are arranged on the first principal surface of the base plate 31. Each microwave circuit component 35 has a plurality of radio frequency (RF) terminals 36 for reception and transmission of a microwave signal having a high frequency of, for example, 2 GHz, 3 GHz, or the like. In the example being illustrated, each radio frequency terminal 36 is extended from the first principal surface to the second principal surface through a through hole 37 formed through the base plate 31. Thus, a coaxial structure is provided by each radio frequency terminal 36, each through hole 37, and the base plate 31.

A plurality of microstrip lines 38 are deposited on the second principal surface of the base plate 31 to electrically connect the microwave circuit components 35 to one another and to form a microwave transmission path. The radio frequency terminals 36 are fixed to the microstrip lines 38 by soldering. Accordingly, masses 39 of solder are formed at points of connection between the radio frequency terminals 36 and the microstrip lines 38. In addition, a plurality of ports or connectors 40 are attached to the wall member 32 and are electrically connected to the microstrip lines 38.

With this structure, processing should be carried out on both sides of the base plate 31 to assemble the microwave circuit components 35 on the base plate 31. In addition, soldering must also be carried out. Accordingly, the illustrated microwave circuit arrangement has various disadvantages as described in the preamble of the instant specification.

Figure 3:
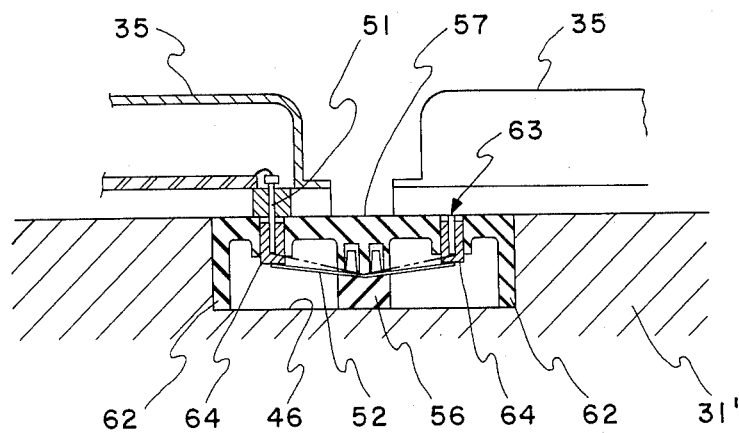
FIG. 3 shows a partial sectional view of a microwave connector assembly according to a first embodiment of this invention.
Figure 4:
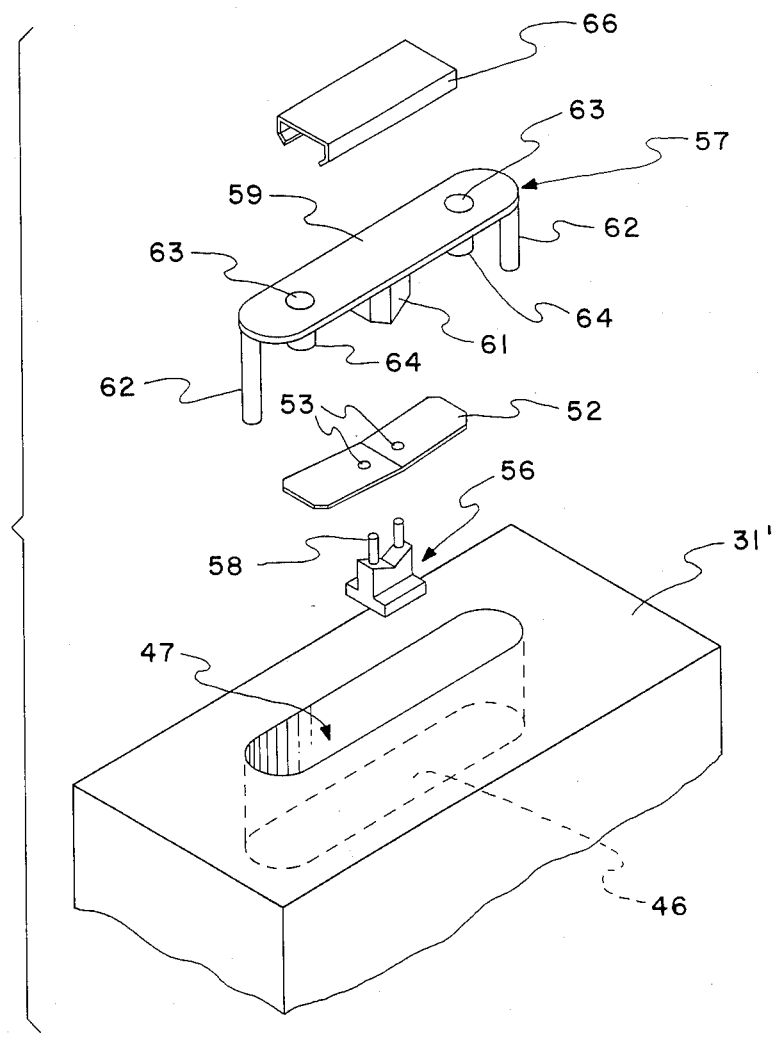
FIG. 4 shows an exploded perspective view of the microwave connector assembly illustrated in FIG. 3.

Referring to FIGS. 3 and 4, a microwave connector assembly according to a first embodiment of this invention is for use in electrical connection between adjacent ones of microwave circuit components depicted at 35 like in FIGS. 1 and 2. The microwave circuit components 35 are arranged on that upper surface of a base plate 31' which may simply be referred to as a principal surface. The illustrated base plate 31' is of a conductive material, for example, aluminum and has an elongated depression 46 recessed relative to the principal surface, as best shown in FIG. 4. The elongated depression 46 is defined by a recessed surface which is recessed relative to the principal surface and which may be called a bottom surface. A wall surface is contiguous to the principal surface and the bottom surface (depicted at 46) to form a cavity or groove 47 in the base plate 31'.

Each of the microwave circuit components 35 has a plurality of radio frequency terminals for the microwave signal. In FIG. 3, only one of the radio frequency terminals is depicted at 51 and is derived from one of the microwave circuit components 35. The illustrated radio frequency terminal 51 is surrounded by an unnumbered metal block and is electrically connected through the microwave connector assembly to another one (not shown) of the radio frequency terminals that is derived from an adjacent one of the microwave circuit components 35.

In FIGS. 3 and 4, the microwave connector assembly is accommodated in the cavity 47 into which two adjacent radio frequency terminals 51 are vertically extended. The illustrated microwave connector assembly comprises an internal or center conductor 52 operable as a leaf spring, as readily seen from FIGS. 3 and 4. The internal conductor 52 has predetermined length and width, a conductor axis extended along a longitudinal direction, a center area transversely of the longitudinal direction, and a pair of end areas on both sides of the center area along the conductor axis.

The internal conductor 52 further has a first surface directed towards the bottom or recessed surface and a second surface directed upwards of FIGS. 3 and 4. In the center area of the internal conductor 52, a pair of through holes 53 are formed symmetrical with respect to that center line of the internal conductor 52 which is extended widthwise. As readily understood from the above, each through hole 53 is defined by an internal surface which surrounds the through hole and which is contiguous to the first and the second surfaces of the internal conductor 52.

The internal conductor 52 is interposed between an insulator support member which comprises a first or lower insulator support 56 under the internal conductor 52 and a second or upper insulator support 57 on the internal conductor 52. The first insulator support 56 comprises an insulating pedestal having a first pedestal surface brought into contact with the bottom surface 46 of the cavity 47 and a second pedestal surface brought into contact with the center area of the internal conductor 52. A pair of projections 58 (FIG. 4) is projected from the second pedestal surface upwards of FIGS. 3 and 4 and may be referred to as a projection member. The projections 58 are allowed to pass through the through holes 53 of the internal conductor 52, as shown in FIG. 3. At any rate, the first insulator support 56 serves to sustain the center area of the internal conductor 52 with the first insulator support 56 interposed between the second surface of the internal conductor 52 and the bottom surface 46.

The second insulator support 57 is for supporting the center area of the internal conductor 52 on a side opposite to the first insulator support 56 and comprises a support base 59 having a front surface directed upwards of FIGS. 3 and 4 and a back surface directed downwards thereof. A protrusion member 61 is protruded from the back surface of the second insulator support 57 towards the internal conductor 52 and is engaged with the projections 58 of the first insulator support 56, as best shown in FIG. 3. As a result, the protrusion member 61 is brought into contact with the center area of the internal conductor 52. Thus, the internal conductor 52 is supported by the first and the second insulator supports 56 and 57.

As shown in FIG. 3, the support base 59 is snugly or tightly received in or fitted to the cavity 47 and is contiguous to a pair of posts 62 which are vertically extended towards the bottom surface 46 along the wall surface. Each of the posts 62 may therefore be called an extension member and has a height substantially equal to a height of the wall surface. As a result, the front surface of the second insulator support 57 and the principal surface are coplanar, as illustrated in FIG. 3.

The support base 59 is perforated at two positions corresponding to both side areas of the internal conductor 52, so as to form two guide holes 63 at the respective positions. In FIGS. 3 and 4, cylindrical conductive contacts 64 are movably positioned in the respective guide holes 63 and brought into contact with the side areas of the internal conductor 52. The contacts 64 may be united with the radio frequency terminals 51. Alternatively, the contacts 64 may be formed independently of the radio frequency terminals 51.

At any rate, the contacts 64 are fixed to the radio frequency terminals 51 and may therefore be called fixed contacts. A gold layer may be deposited by gold plating at least on contact portions of the fixed contacts 64 and the internal conductor 52. Alternatively, each of the fixed contacts 64 and the internal conductor 52 is completely covered with a gold layer.

In FIG. 4, a metal plate 66 (not shown in FIG. 3) has planar surface and a pair of flanges extended downwardly from the planar surface, as shown in FIG. 4. As a result, the metal plate 66 partially covers the support base 59 to shield the internal conductor 52 from each microwave circuit component 35 which is mounted on the metal plate 66. Thus, the internal conductor 52 is completely shielded by the metal plate 66 from the microwave circuit component 35. However, the metal plate 66 is not always used in the microwave connector assembly.

With this structure, the base plate 31' defines the cavity 47 by providing the bottom surface 46 and the wall surface. This means that the base plate 31' is operable as a part of the microwave connector assembly because the base plate 31' serves to shield the internal conductor 52 from external circuits. In this sense, the base plate 31' may be referred to as an external conductor member of the microwave connector assembly.

Figure 5:
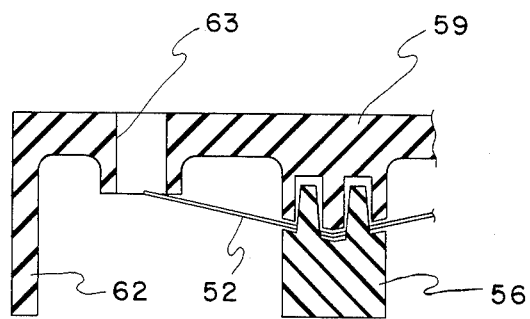
FIG. 5 shows an enlarged sectional view of a part of the microwave connector assembly illustrated in FIGS. 3 and 4 so as to describe a prior state to a contact operation.
Figure 6:
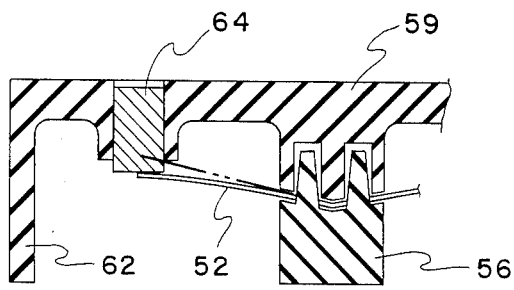
FIG. 6 shows a similar view for use in describing the contact operation of the part of the microwave connector assembly shown in FIGS. 3 and 4.

Referring to FIGS. 5 and 6 together with FIG. 3, description will be made about mutual contact between the internal conductor 52 and the fixed contact 64 (not shown in FIG. 5). As illustrated in FIG. 5, when the fixed contact 64 is not fitted into the guide hole 63, the internal conductor 52 is subjected to no substantial elastic deformation. In other words, elastic deformation of the internal conductor 52 is negligibly small when the internal conductor 52 is not brought into contact with the fixed contact 64.

On the other hand, the internal conductor 52 is urged downwards into contact with the fixed contact 64 and is displaced downwards when the fixed contact 64 is inserted into the guide hole 63, as shown in FIG. 6. Such downward displacement of the internal conductor 52 gives a substantially constant contact pressure to the fixed contact 64. In other words, the internal conductor 52 presses the fixed contact 64 upwards of FIG. 6 at the substantially constant contact pressure. Such a contact pressure should be adjusted so that neither imperfect contact nor excessive deformation of the internal conductor 52 occurs. The imperfect contact might occur when the contact pressure is too weak while the excessive deformation might occur when the contact pressure transgresses a yield stress point of the internal conductor 52.

With this structure, it is possible to allay discontinuity of a microwave transmission line formed through the microwave circuit components 35, the radio frequency terminals 51, and the internal conductor 52. The transmission line formed by each radio frequency terminal 51 is converted at the circular fixed contact 64 into a transmission line of a so-called trough-line which is formed when a circular center conductor is placed within a pair of parallel plates grounded. The trough-line type transmission line is connected to the transmission line which is formed by the internal conductor 52 of an edge-line type. In the trough-line type transmission line, an electromagnetic field is mainly distributed or concentrated on the sides of the grounded plates while an electromagnetic field in the edge-line type transmission line is concentrated at both edge portions of the internal conductor 52. Accordingly, electrical connection between the fixed contact 64 and the internal conductor 52 is smooth without any discontinuity.

In addition, it is also possible to keep a constant relationship of relative positions between the parts of the microwave connector assembly. This means that a stable and invariable electrical connection can be accomplished by the illustrated microwave connector assembly. Therefore, the microwave connector assembly has excellent stability and reproducibility of the electrical connection. More particularly, the internal conductor 52 is accurately located by the first and the second insulator supports 56 and 57. In particular, the second insulator support 57, namely, the support base 59 has a configuration and a size fittable to the cavity 47 without a substantial clearance between the support base 59 and the wall surface. The internal conductor 52 is positioned in a vertical direction of the cavity 47 because precise positioning of the internal conductor 52 in the vertical direction is possible by the use of the posts 62. The relative positional relationship between the fixed contact 64 and the internal conductor 52 is also kept accurate because the fixed contact 64 is guided by the guide hole 63.

Such a constant relationship of the relative positions brings about invariable characteristics of the transmission line.

Moreover, the cavity 47 is remarkably small in comparison with the microstrip lines 38 as shown in FIGS. 1 and 2.

Figure 7:
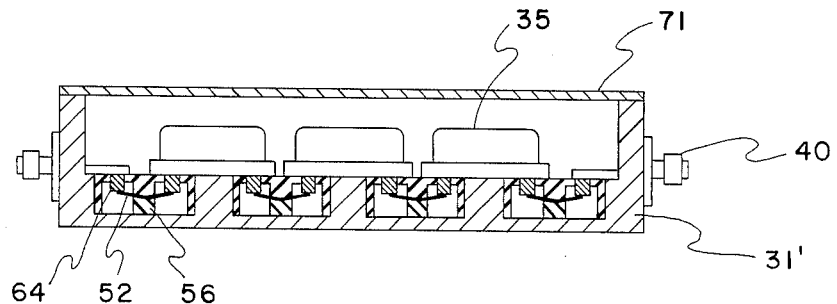
FIG. 7 shows a sectional view of a microwave circuit arrangement comprising a plurality of microwave connector assemblies each of which is identical in structure with that illustrated in FIGS. 3 and 4.
Figure 8:
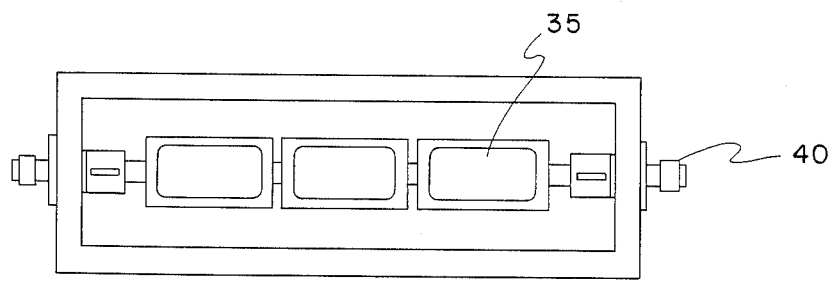
FIG. 8 shows a plan view of a microwave circuit arrangement illustrated in FIG. 7 with a cover removed.

Referring to FIGS. 7 and 8, a microwave circuit arrangement comprises three of the microwave circuit components 35 connected between two ports 40 in series to one another through four of the microwave connector assemblies as described with reference to FIGS. 3 and 4. Each of the microwave connector assemblies is accommodated in each cavity formed in the base plate 31' which serves as a part of a conductive housing. The conductive housing comprises a wall vertically extended upwards of FIG. 7 from a periphery of the base plate 31' and a cover 71 attached to the wall to define an inner space for accommodating the microwave circuit components 35.

At any rate, no soldering is necessary in the illustrated circuit arrangement to connect the microwave circuit components to the microwave connector assemblies. Accordingly, it is possible to rapidly assemble the microwave circuit components 35 and the microwave connector assemblies together.

Figure 9:
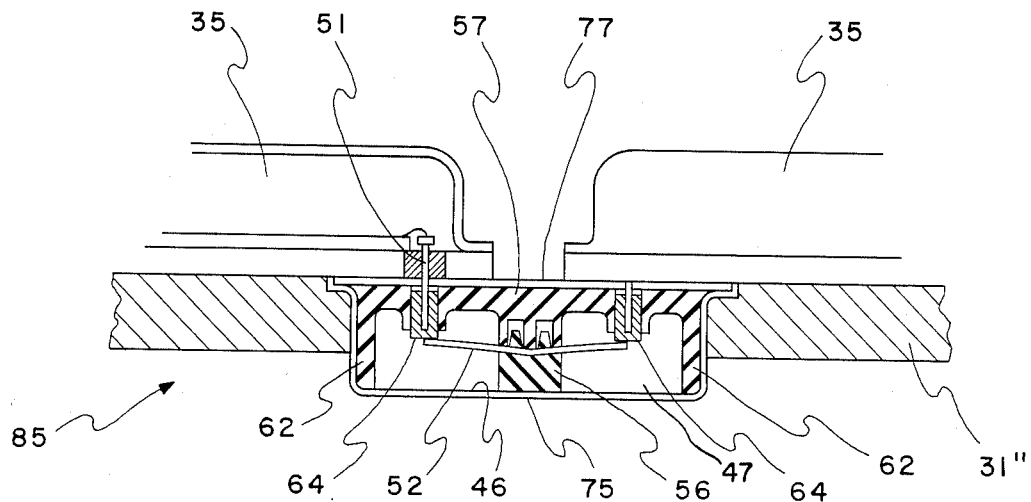
FIG. 9 shows a partial sectional view of a microwave connector assembly according to a second embodiment of this invention.
Figure 10:
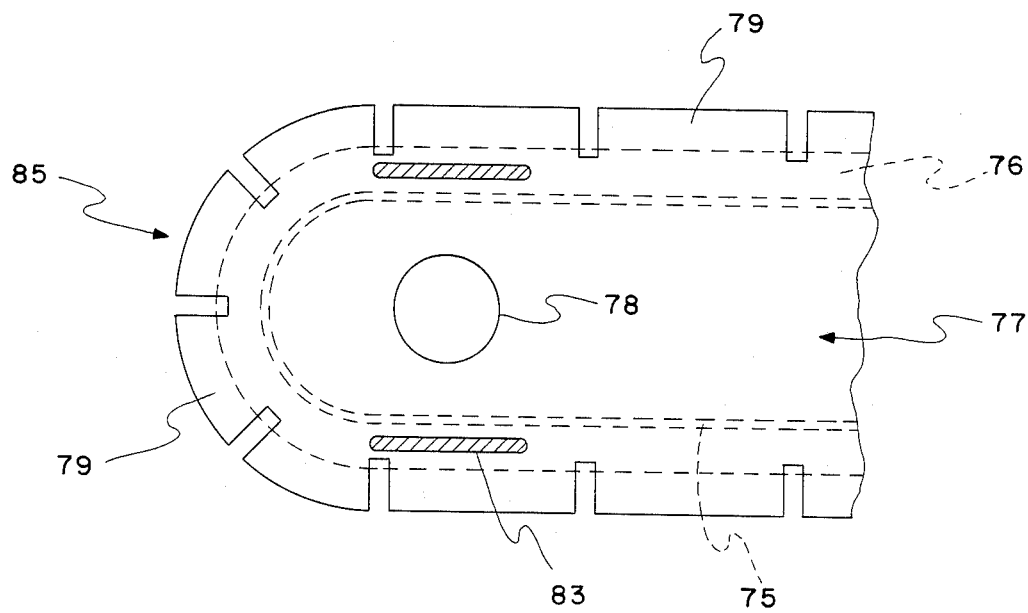
FIG. 10 shows an enlarged plan view of the microwave connector assembly illustrated in FIG. 9.

Referring to FIGS. 9 and 10, a microwave connector assembly according to a second embodiment of this invention is similar in structure to that described with reference to FIGS. 3 and 4 except that the external conductor member of the microwave connector assembly is formed by a conductive shield case 75 for defining a cavity 47 similar to that illustrated in FIGS. 3 and 4. The conductive shield case 75 is opened upwards of FIG. 9 at an end thereof, as readily understood from FIG. 9, and has a bottom portion and a wall portion vertically extended from the bottom portion. The bottom and the wall portions define a bottom surface 46 and a wall surface, respectively, like in FIGS. 3 and 4. A flange portion 76 (illustrated in FIG. 10) is contiguous to the wall portion and horizontally extended outwards of the cavity 47.

In FIGS. 9 and 10, a conductive cover plate 77 is attached to the flange 76 in a manner to be described later to define an inner space in the conductive cover plate 77 and the conductive shield case 75. In the inner space, the internal conductor 52 is accommodated together with the first and the second insulator supports 56 and 57 and the fixed contacts 64 fixed to the radio frequency terminals 51 derived from adjacent ones of the microwave circuit components 35.

As shown in FIG. 10, the cover plate 77 is perforated at positions corresponding to the fixed contacts 64 to provide a pair of apertures 78 only one of which is illustrated in FIG. 10. Each fixed contact 64 is entered into the inner space through each aperture 78 with the fixed contact 64 fixed to the radio frequency terminal 51. A peripheral area of the cover plate 77 is extended outwards of the flange portion 76 of the conductive shield case 75 and cut into a plurality of pieces 79 each of which acts like a leaf spring when the cover plate 77 is mounted on a base plate depicted at 31" in FIG. 9.

Figure 11:
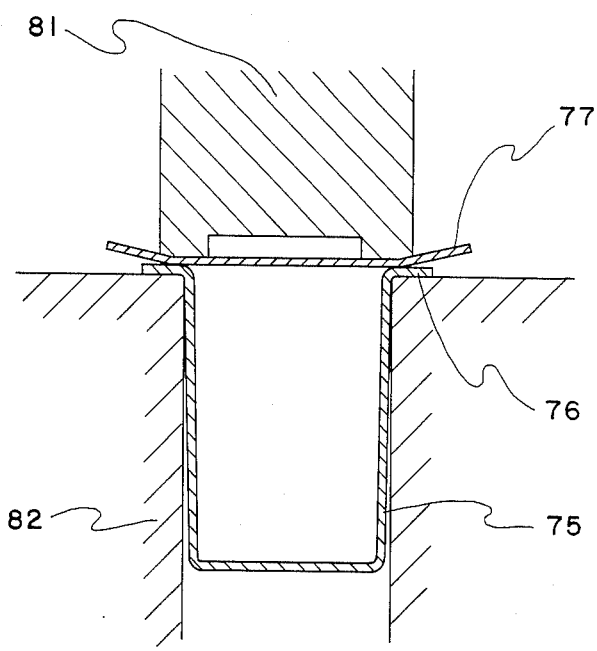
FIG. 11 shows a schematic sectional view for use in describing a process of manufacturing the microwave connector assembly illustrated in FIGS. 9 and 10.

Referring to FIG. 11 together with FIG. 10, the cover plate 77 is attached to the flange portion 76 of the conductive shield case 75 by projection welding. Such projection welding is carried out by interposing the flange portion 76 and the cover plate 77 between a pair of projection welding electrodes 81 and 82. The internal conductor 52 is supported in the inner space by the first and the second insulator supports 56 and 57 prior to the projection welding, although not shown in FIG. 11. Thus, the cover plate 77 is welded to the conductive shield case 75 at welded portions 83 (FIG. 10) and united with conductive shield case 75 into a connector unit 85, as shown in FIG. 10. From this fact, it is seen that the connector unit 85 is a combination of the internal conductor 52, the first and the second insulator supports 56 and 57, the posts 62, the shield case 75, and the cover plate 77.

Figure 12:
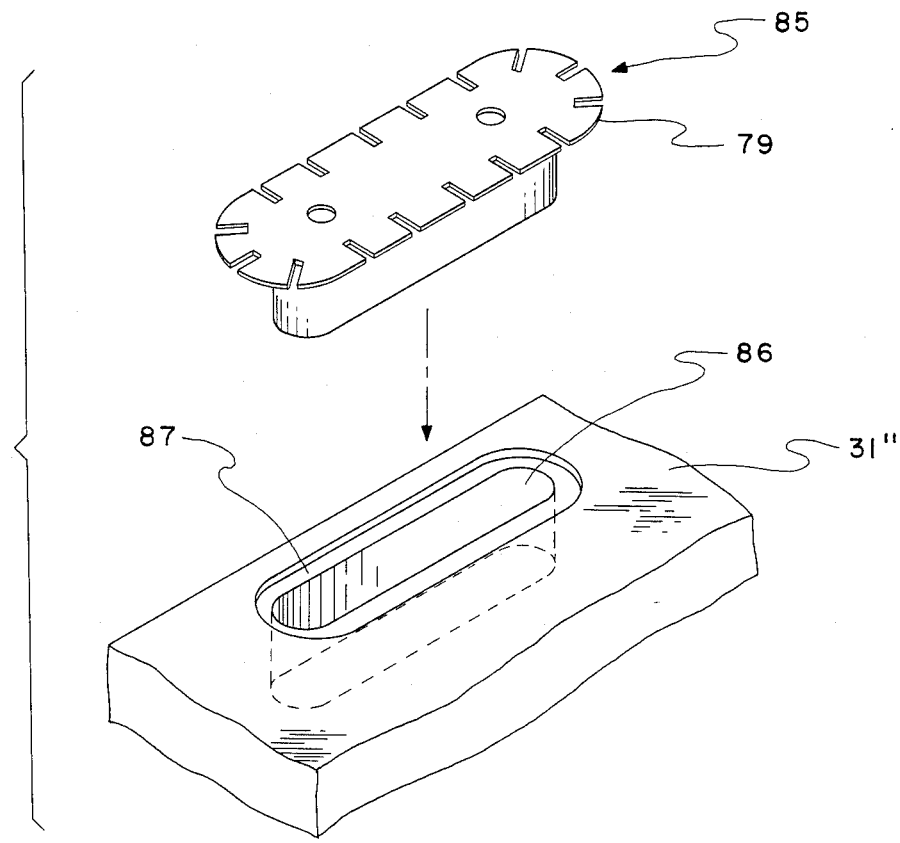
FIG. 12 shows an exploded perspective view for use in describing a process of mounting the microwave connector assembly illustrated in FIGS. 9 and 10.

Referring to FIG. 12 afresh and FIG. 9 again, the illustrated base plate 31" may be either conductive or nonconductive and has a first principal surface directed downwards of FIGS. 9 and 12, a second principal surface directed upwards thereof, and an opening 86 which passes through the base plate 31". The base plate 31" comprises a counterbore portion 87 somewhat recessed from the second principal surface around the opening 86. The counterbore portion 87 serves to snugly receive or seat the connector unit 85 by supporting the pieces 79 of the cover plate 77 on the counterbore portion 87.

Thus, the connector unit 85 can readily be attached to the base plate 31" by introducing the connector unit 85 into the opening 86. In this event, the opening 86 solely acts to guide the connector unit 85. Therefore, the opening 86 may not accurately be formed in the base plate 31". This means that the base plate 31" may be formed by casting without an intricate machining operation and the like after the casting. Accordingly, use of the illustrated connector unit 85 is capable of reducing costs in comparison with the connector assembly illustrated in FIGS. 3 and 4.

The connector unit 85 may be singly inspected or tested independently of the microwave circuit components 35 before the connector unit 85 is assembled on the base plate 31". Therefore, it is possible to improve reliability of the connector unit 85 and to assure excellent performance thereof. No electrical coupling takes place between the internal conductor 52 and an external circuit because the internal conductor 52 is shielded from the external circuit. Such shielding also serves to avoid imperfect contact which might otherwise occur due to dust, oil, and the like.

Figure 13:
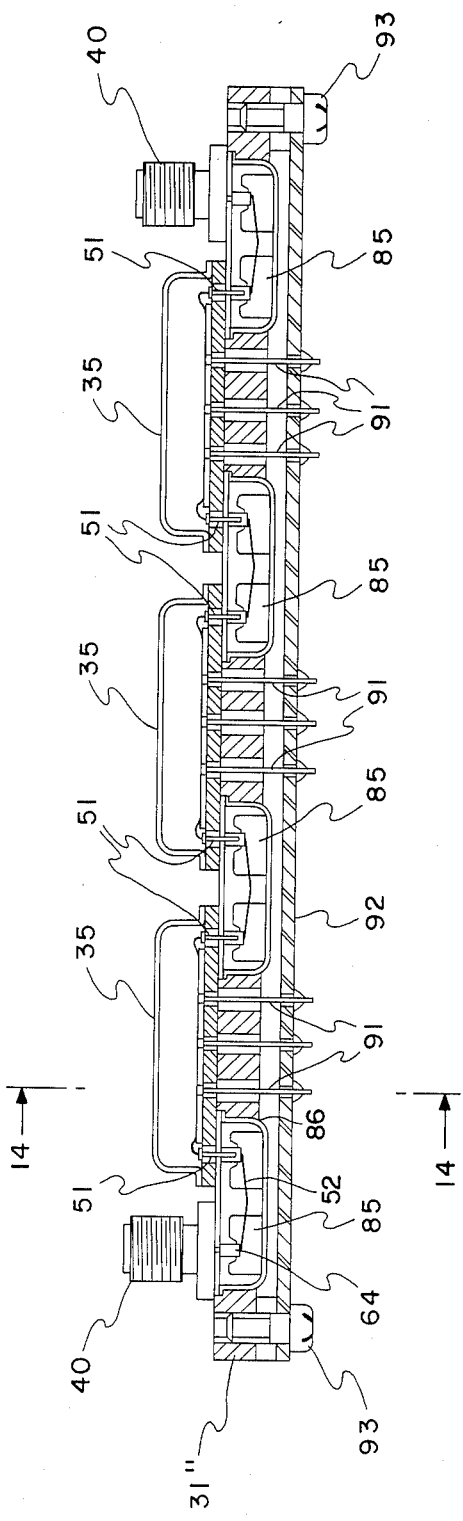
FIG. 13 shows a sectional view of a microwave circuit arrangement according to a third embodiment of this invention.
Figure 14:
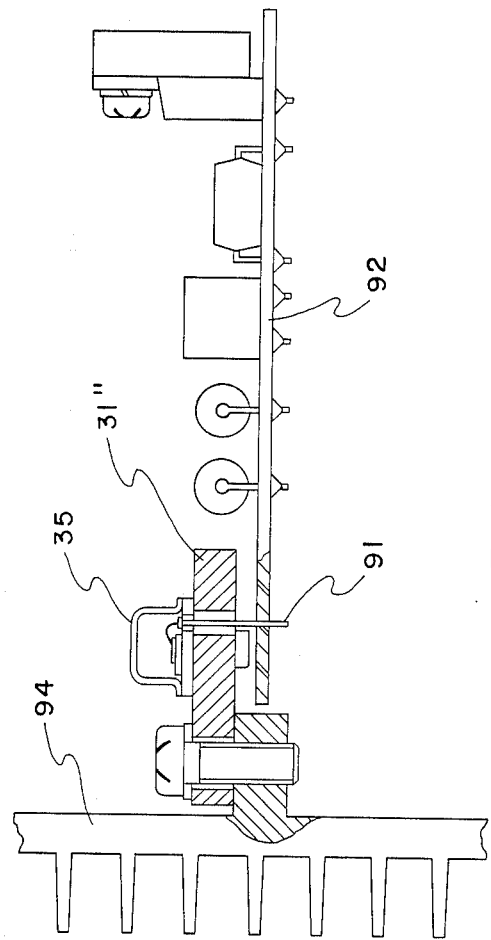
FIG. 14 shows a side view of the microwave arrangement depicted in FIG. 13, partly in section taken along a line 14—14 illustrated in FIG. 13.

Referring to FIGS. 13 and 14, a microwave circuit arrangement according to a third embodiment of this invention is for use in electrically connecting three of microwave circuit components 35 in series to one another between a pair of connectors 40 through four of microwave connector assemblies each of which is the same as that illustrated with reference to FIGS. 9 through 12. In this connection, each of the microwave connector assemblies comprises a connector unit 85 as illustrated in FIG. 12 and a pair of fixed contacts 64 each of which is connected to a radio frequency terminal 51 derived from each microwave circuit component 35. As illustrated in FIG. 13, the connector units 85 are placed between each connector 40 and the adjacent microwave circuit components 35 and between two adjacent ones of the microwave circuit components 35.

The connector units 85 are attached to the base plate 31" having the openings 86 in the manner illustrated in conjunction with FIGS. 9 and 12. The connectors 40 and the radio frequency terminals 51 are connected to the inner conductors 52 through the fixed contacts 64 within the inner spaces of the connector units 85.

A microwave signal is sent from either one of the connectors 40 through the microwave connector assemblies and the microwave circuit components 35 to the other one of the connectors 40, with the microwave signal processed in each of the microwave circuit components 35. Therefore, the microwave signal is enclosed within the connector units 85 and the microwave circuit components 35. As a result, the microwave signal appears only in restricted spaces of the connector units 85 and the components 35. With this structure, it is therefore possible to prevent leakage of the microwave signal.

Although each microwave circuit component 35 is operable in response to the microwave signal, each microwave circuit component 35 must often be supplied with a d.c. signal or an intermediate frequency signal having a frequency lower than that of the microwave signal. In other words, a bias circuit or the like should often be connected to each microwave circuit component 35. For this purpose, each of the circuit components 35 has three bias terminals 91.

In the example being illustrated in FIG. 13, the bias circuit is formed on a print board 92 which is independent of the base plate 31" and which is mechanically fastened to the base plate 31" by the use of a plurality of screws 93. The bias terminals 91 of each microwave circuit component 35 are allowed to pass through holes of the print board 92 and are soldered to the print board 92 to be electrically connected to the bias circuit formed on the print board 92. As a result, masses of solder are formed around the bias terminals 91 on the print board 92.

Thus, the bias circuit is completely isolated from a microwave circuit of each microwave circuit component 35 in the illustrated circuit arrangement.

As shown in FIG. 14, a plurality of circuit elements are mounted on the print board 92 so as to form the bias circuit. Although not shown in FIG. 13, a thermal radiator 94 is mechanically firmly fastened to the base plate 31" by a threaded screw (unnumbered), as shown in FIG. 14. Such a radiator 94 serves to rapidly radiate heat generated by the microwave circuit components 35.

Figure 15:
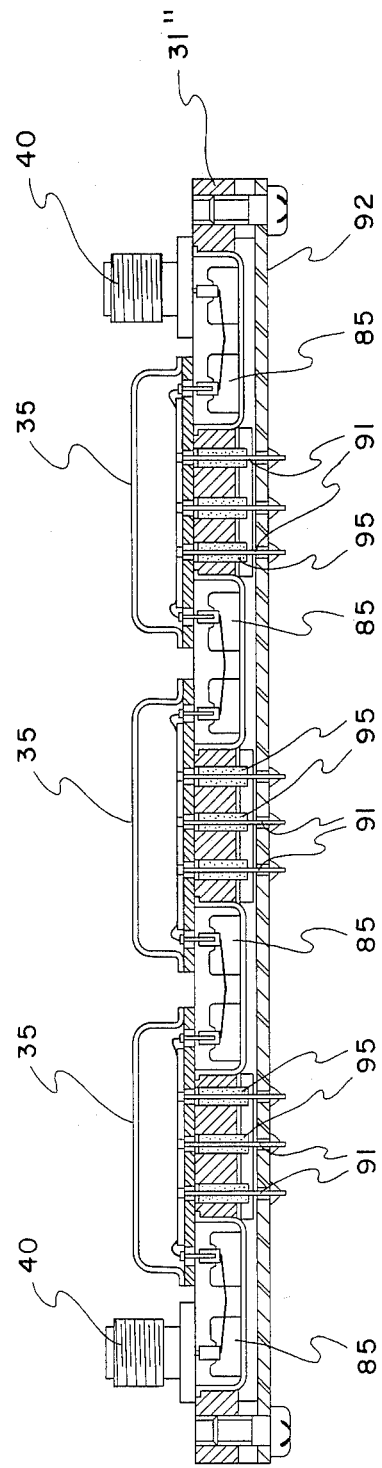
FIG. 15 shows a sectional view of a microwave circuit arrangement according to a fourth embodiment of this invention.

Referring to FIG. 15, a microwave circuit arrangement according to a fourth embodiment of this invention is similar to that illustrated in FIG. 13 except that cylindrical microwave absorbers 95 are attached to the respective bias terminals 91. Specifically, each microwave absorber 95 is inserted into a gap left between each bias terminal 91 and the base plate 31".

As usual, each bias terminal is electrically isolated from a microwave circuit by a filter circuit or the like in each microwave circuit component 35. However, such electrical isolation is often insufficient because the filter circuit is encapsulated in a very small space of the microwave circuit component 35. Insufficient isolation gives rise to undesired coupling of the microwave signal to each bias terminal 91 and disturbs a normal operation of the microwave circuit accommodated in each microwave circuit component 35.

In order to obtain sufficient isolation between the microwave signal and each bias terminal 91, the microwave absorbers 95 are mounted on the respective bias terminals 91 in the illustrated circuit arrangement and may be of ferrite.

Figure 16:
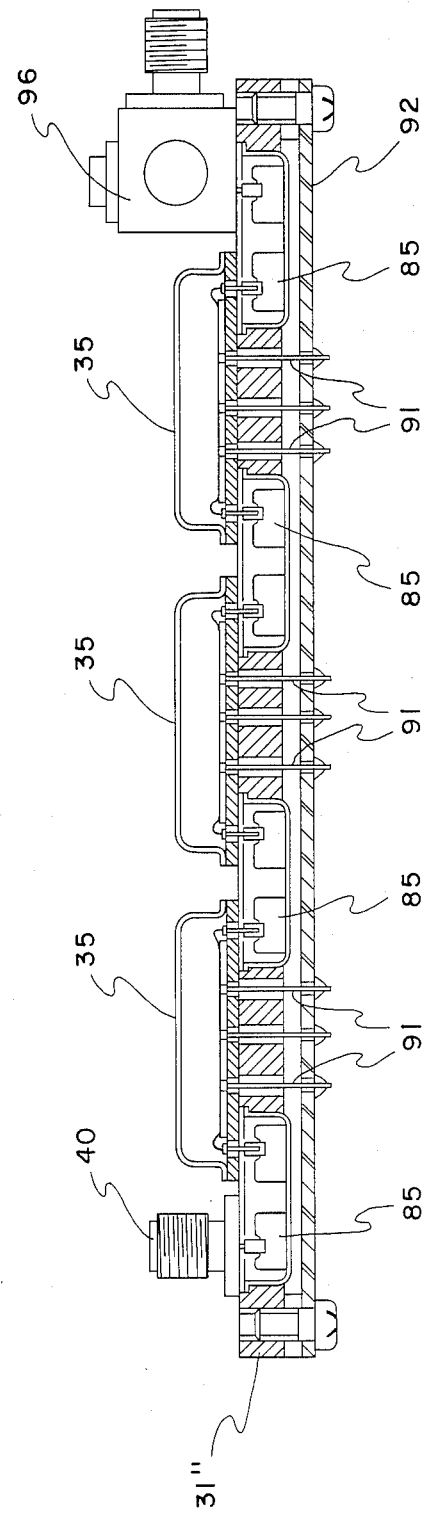
FIG. 16 shows a similar view of a microwave circuit arrangement according to a fifth embodiment of this invention.

Referring to FIG. 16, a microwave circuit arrangement according to a fifth embodiment of this invention is similar to that illustrated in FIG. 13 except that an isolator 96 is connected to a rightmost one of the connector units 85 in place of one of the connectors 40. With this structure, it is possible to improve a matching characteristic of input and output impedances. Thus, use of the illustrated connector units 85 facilitates to assemble the isolator 96.

Referring to FIGS. 17 and 18, a microwave circuit arrangement according to a sixth embodiment of this invention comprises similar parts designated by like reference numerals. In FIG. 17, three terminal connectors 97 are fixed to the print board 92 by soldering and receive the bias terminals 91 of the microwave circuit components 35. The terminal connectors 97 can be assembled on the print board 92 before the base plate 31" is assembled on the print board 92. When the terminal connectors 97 are used to connect the bias terminals 91 to the bias circuit, any soldering becomes unnecessary on connecting the microwave circuit components 35 to the bias circuit. Consequently, a manufacturing process becomes very simple with this structure. Moreover, repair of the circuit becomes very easy by the use of the terminal connectors 97 because no soldering is necessary.

As shown in FIG. 18, each microwave circuit component 35 may preferably be fastened to the base plate 31" by metal screws 98 attached through a flange of each component 35 to the base plate 31". With this structure, each circuit component 35 is readily attachable to and detachable from the base plate 31" by the use of each metal screw.

Figure 19:
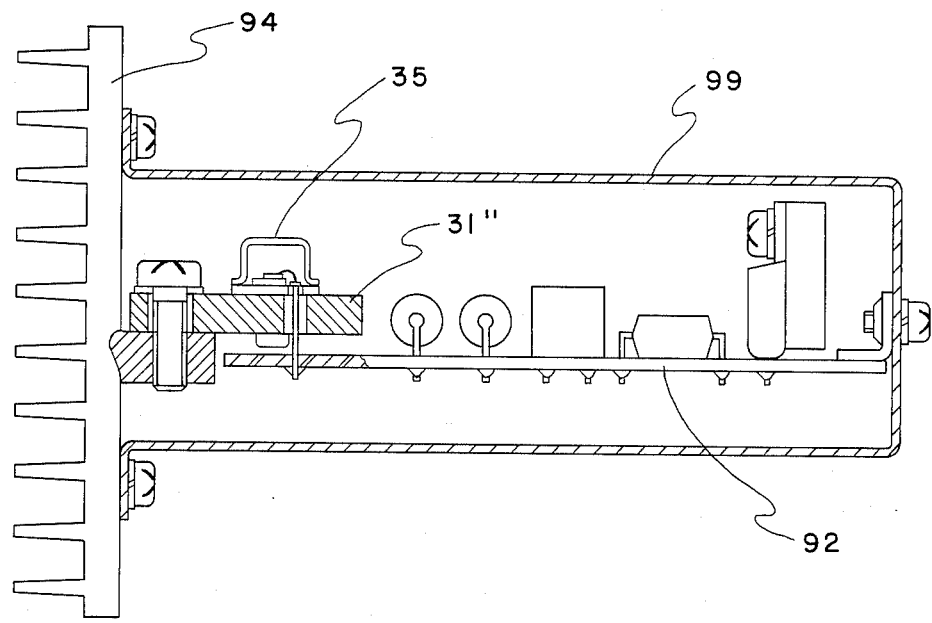
FIG. 19 shows a partial sectional view of a microwave circuit arrangement according to a seventh embodiment of this invention.

Referring to FIG. 19, a microwave circuit arrangement according to a seventh embodiment of this invention is similar to that illustrated in FIG. 18 except that a conductive shield case 99 is attached to the radiator 94. A whole of the base plate 31", the microwave circuit components 35, the microwave connector assemblies, the print board 92, and the circuit elements are covered with the conductive shield case 99 with only the connectors 40 (not shown in this figure) uncovered. Accordingly, only the connectors 40 are placed outside the conductive shield case 99 with this structure. The illustrated microwave circuit arrangement exhibits an excellent shield effect and is very effective when the microwave circuit included in each microwave circuit component must be operated over a wide dynamic range.

Figure 20:
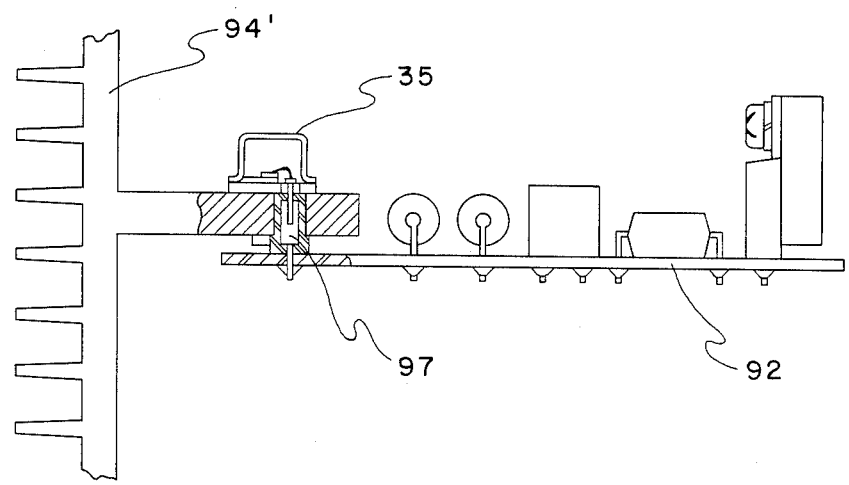
FIG. 20 shows a side view of a microwave circuit arrangement according to an eighth embodiment of this invention with the circuit arrangement partially cut away.

Referring to FIG. 20, a microwave circuit arrangement according to an eighth embodiment of this invention is similar to that illustrated in FIG. 18 except that a radiator 94' is used also as a base plate. This circuit arrangement dispenses with the base plate and can improve thermal conduction to a certain degree in comparison with that illustrated in FIG. 18.

Handling of the illustrated circuit arrangement might become slightly difficult on assembling and testing the microwave circuit arrangement because the radiator 94' of a big size is directly attached to the print board 92. However, such difficulty of handling does not raise any serious problem.

Figure 21:
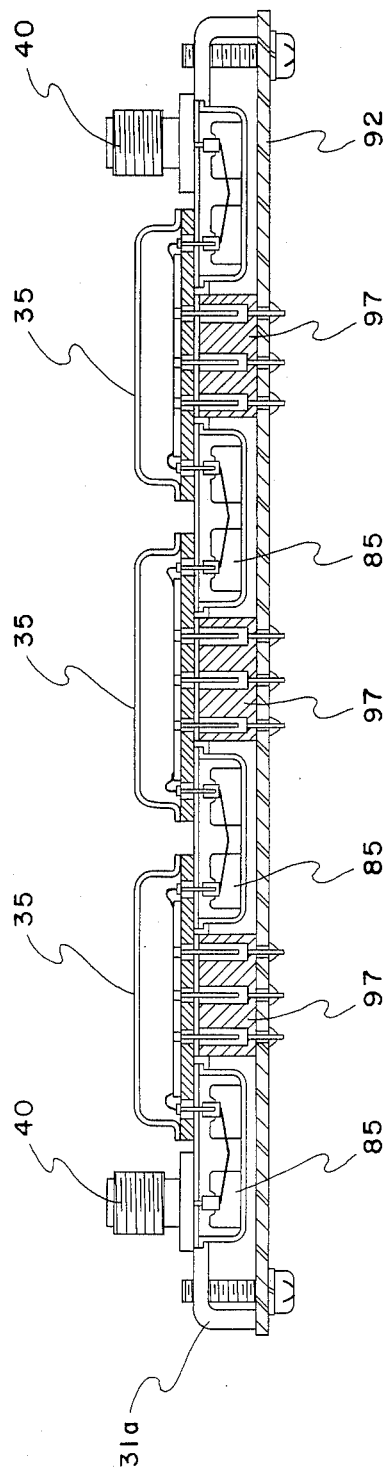
FIG. 21 shows a sectional view of a microwave circuit arrangement according to a ninth embodiment of this invention.
Figure 22:
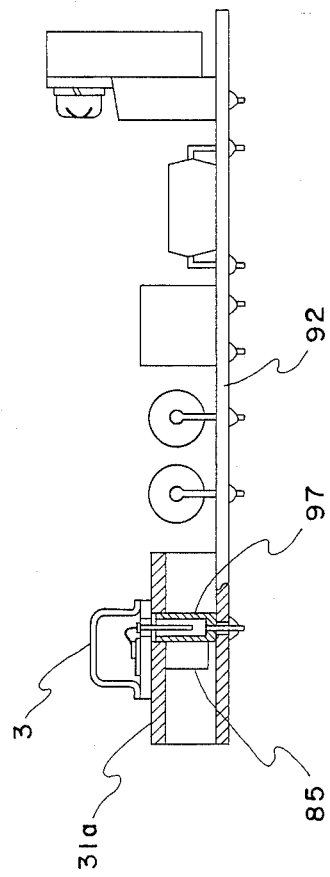
FIG. 22 shows a side view of the microwave circuit arrangement illustrated in FIG. 21, with a part of the circuit arrangement cut away.

Referring to FIGS. 21 and 22, a microwave circuit arrangement according to a ninth embodiment of this invention is similar to that illustrated in FIG. 17 except that a thin base plate depicted at 31a is used to support the microwave circuit components 35 and the microwave connector assemblies, namely, the connector units 85. The illustrated circuit arrangement is effective when each circuit component has small calorific power. The illustrated circuit arrangement can be readily handled like a single print board because it is very thin as compared with the other circuit arrangements mentioned before. The base plate 31a may serve only as a support for the microwave circuit components 35, the microwave connector assemblies, and the connectors 40 and may be either of a conductor or of an insulator, such as a plastic material.

Figure 23:
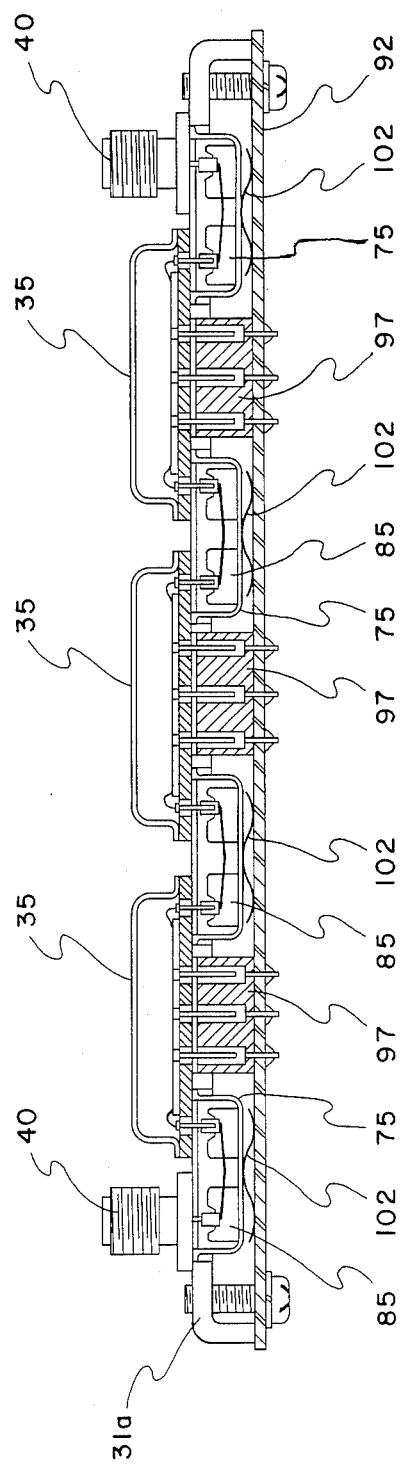
FIG. 23 shows a sectional view of a microwave circuit arrangement according to a tenth embodiment of this invention.
Figure 24:
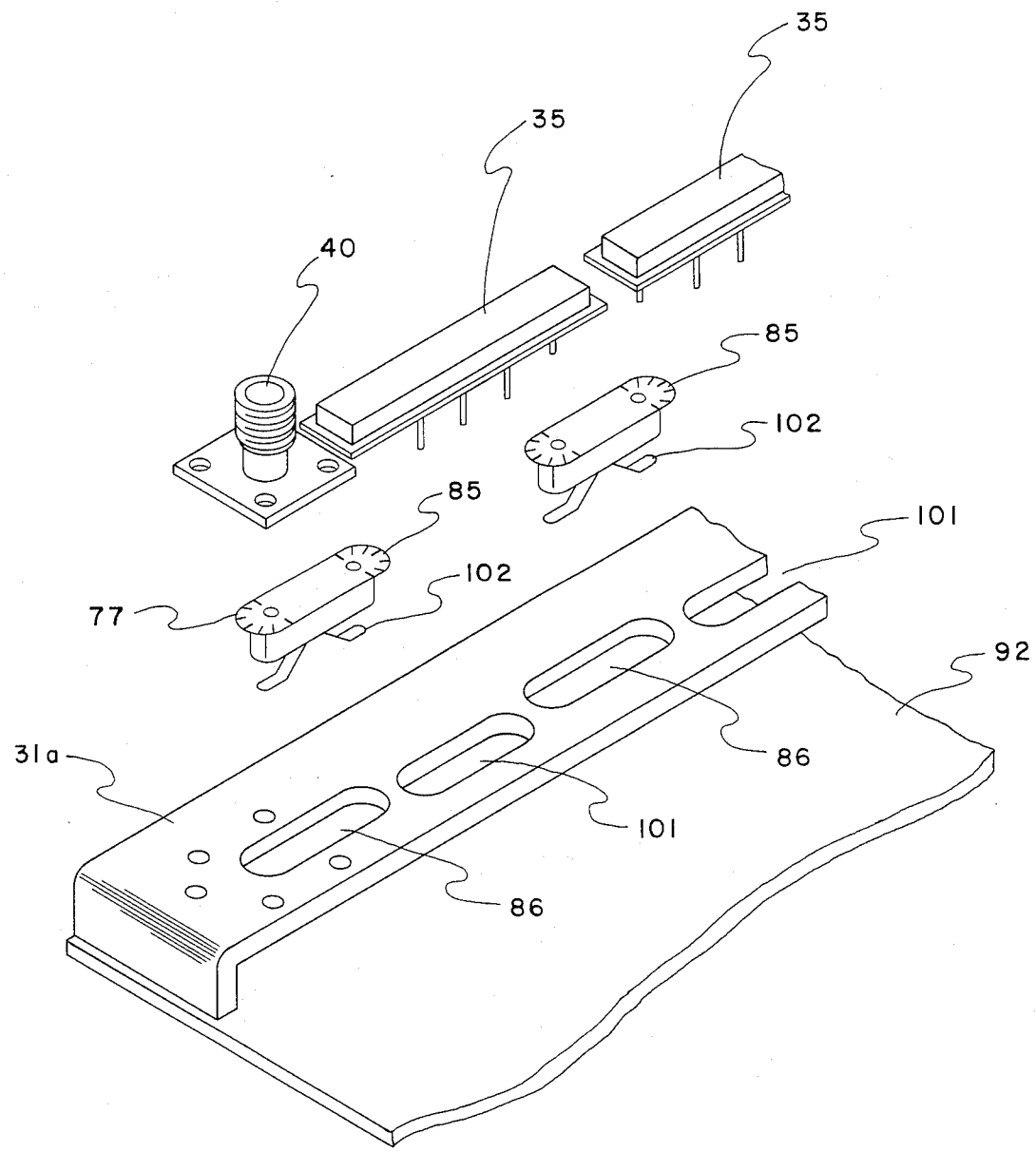
FIG. 24 shows an exploded perspective view of the microwave circuit arrangement illustrated in FIG. 23.

Referring to FIGS. 23 and 24, a microwave circuit arrangement according to a tenth embodiment of this invention comprises similar parts designated by like reference numerals in FIG. 21. In FIGS. 23 and 24, it is to be noted that the thin base plate 31a has no counterbore portions around the openings 86 for positioning the connector units 85, as best shown in FIG. 24. Such openings 86 can readily be opened in comparison with the openings accompanied by the counterbore portions and can be formed by a usual press machine. In FIG. 24, a plurality of slots 101 are also opened together with the openings 86 so as to locate the connectors 97 (not shown in FIG. 24).

In addition, a leaf spring element 102 is attached to a bottom portion of the shield case 75 of each connector unit 85 by spot welding or the like. According to this structure, the connector unit 85 can be located on the print board 92 only by introducing the connector units 85 into the openings 86 downwards. Thereafter, each of the connector units 85 is pressed downwards of FIGS. 23 and 24 when the microwave circuit components 35 and the connectors 40 are positioned on each connector unit 85. As a result, each cover plate 77 of the connector units 85 is strongly brought into contact with a bottom of each microwave circuit component 35. Thus, the connector units 85 are desirably and stably contacted with the microwave circuit components 35.

From FIG. 24, it is readily understood that the microwave circuit components 35 and the connector units 85 occupy only a part of the print board 92 and has no chassis therefor. This means that it is possible to extremely reduce costs for assembling the microwave circuit arrangement because a chassis can be omitted from the illustrated circuit arrangement. Such omission of a chassis contributes to lightening the circuit arrangement in weight and to compactness of the circuit arrangement. The illustrated print board 92 may be an epoxy glass print plate, a phenol resin print plate, a flexible print plate, a thick film print plate, or the like.

At any rate, the illustrated circuit arrangement is of a flat type, in spite of the fact that the microwave circuit is combined with the bias circuit.

While this invention has thus far been described in conjunction with about ten embodiments thereof, it will readily be possible for those skilled in the art to put this invention into practice in various other manners. For example, the cover plate 77 in FIG. 10 may be divided into a plurality of fractions around the guide holes 78. In FIG. 4, a single through hole may be opened on the internal conductor 52.

What is claimed is:

1. A microwave connector assembly for use in electrical connection between terminals of microwave circuit components, wherein the improvement comprises:
an internal conductor which is operable as a leaf spring and which has a conductor axis extended along a predetermined direction, a center area transversely of said conductor axis, and a pair of end areas on both sides of said center area along said conductor axis;
an insulator support member for supporting said internal conductor at said center area;
a pair of contacts to be urged towards said terminals by said internal conductor with said contacts brought into contact with said end areas of said internal conductor, respectively; and
an external conductor member having bottom and wall surfaces which define a cavity for accommodating said internal conductor, said insulator support member, and said contact pair with said insulator support member attached to said bottom surface.

2. A microwave connector assembly as claimed in claim 1, said microwave connector assembly comprising a conductive base plate having a principal surface on which said microwave circuit components are to be mounted, wherein said bottom surface is recessed relative to said principal surface to form said cavity, said wall surface being contiguous to said bottom and said principal surfaces.

3. A microwave connector assembly as claimed in claim 2, wherein said internal conductor has a first surface directed towards said bottom surface and a second surface directed towards said contacts;
said insulator support member comprising:

a first insulator support for sustaining said center area of the internal conductor with said first insulator support interposed between said first surface of the internal conductor and said bottom surface;

a second insulator support for pressing said center area of the internal conductor towards said first insulator support with said second insulator support attached to said second surface of the internal conductor; and an extension member contiguous to said second insulator support and extended along said wall surface towards said bottom surface.

4. A microwave connector assembly as claimed in claim 3, wherein said wall surface has a predetermined height;

said extension member having a height which is substantially equal to said predetermined height.

5. A microwave connector assembly as claimed in claim 3, wherein said internal conductor has at least one internal surface contiguous to said first and said second surfaces at said center area to define at least one through hole at said center area;

said first insulator support comprising:

an insulating pedestal having a first pedestal surface brought into contact with said bottom surface and a second pedestal surface directed towards said first surface of the internal conductor; and a projection member projected from said second pedestal surface towards said second insulator support through said at least one through hole;

said second insulator support comprising:

a support base contiguous to said extension member; and a protrusion member extended from said support base towards said internal conductor and brought into contact with said second surface of the internal conductor with said protrusion member engaged with said projection member at said center area of the internal conductor.

6. A microwave connector assembly as claimed in claim 1, wherein said external conductor member comprises:

a conductive case having said bottom and said wall surfaces to define said cavity; and a conductive cap attached to said conductive case to cover said cavity therewith with parts of said conductive cap left uncovered to receive said contacts, respectively.

7. A microwave connector assembly as claimed in claim 6, wherein said internal conductor has a first surface directed towards said bottom surface and a second surface directed towards said contacts;

said insulator support member comprising:

a first insulator support for sustaining said center area of the internal conductor with said first insulator support interposed between said first surface of the internal conductor and said bottom surface;

a second insulator support for supporting said center area of the internal conductor on a side opposite to said first insulator support with said second insulator support attached to said second surface of the internal conductor; and an extension member contiguous to said second insulator support and extended along said wall surface towards said bottom surface.

8. A microwave connector assembly as claimed in claim 7, wherein said internal conductor has at least one through hole at said center area;

said first insulator support comprising:

an insulating pedestal having a first pedestal surface brought into contact with said bottom surface and a second pedestal surface directed towards said first surface of the internal conductor; and a projection member projected from said second pedestal surface towards said second insulator support through said at least one through hole;

said second insulator support comprising:

a support base contiguous to said extension member; and a protrusion member extended from said support base towards said internal conductor and brought into contact with said second surface of the internal conductor with said protrusion member engaged with said projection member at said center area.

9. A microwave circuit arrangement comprising:

a base plate;

a plurality of microwave circuit components each of which has a plurality of terminals extended through said base plate, each of said components being responsive to a microwave signal in a microwave frequency band and to an additional signal in an additional frequency band which is lower than said microwave frequency band;

a plurality of microwave connector assemblies, each of said microwave connector assemblies being electrically connected between two adjacent ones of said microwave circuit components to put said microwave circuit components into operation in said microwave frequency band;

a print board having a printed circuit which is electrically connected to said microwave circuit elements to supply said additional signal to said microwave circuit elements; and mechanical coupling means for mechanically coupling said base plate to said print board with a spacing left between said base plate and said print board;

each of said microwave connector assemblies comprising:

an internal conductor which is operable as a leaf spring and which has a conductor axis extended along a predetermined direction, a center area transverse with respect to said conductor axis, and a pair of end areas on both sides of said center area along said conductor axis;

an insulator support member for supporting said internal conductor at said center area;

a pair of contacts urged towards said terminals by said internal conductor with said contacts brought into contact with said end areas of said internal conductor, respectively; and an external conductor member having bottom and wall surfaces which define a cavity for accommodating said internal conductor, said insulator support member, and said contact pair with said insulator support member attached to said bottom surface.

10. A microwave circuit arrangement as claimed in claim 9, said plurality of the terminals of each microwave circuit component being divisible into a plurality of radio frequency terminals for said microwave signal and an additional terminal for said additional signal, said microwave circuit arrangement further comprising an absorber attached to said additional terminal for absorbing said microwave signal.

11. A microwave circuit assembly as claimed in claim 9, wherein said external conductor member comprises:
- a conductive case having said bottom and said wall surfaces to define said cavity; and
- a conductive cap attached to said conductive case to cover said cavity therewith with parts of said conductive cap left uncovered to receive said contacts, respectively.

12. A microwave circuit arrangement as claimed in claim 11, wherein said internal conductor has a first surface directed towards said bottom surface and a second surface directed towards said contacts;
said insulator support member comprising:
- a first insulator support for sustaining said center area of the internal conductor with said first insulator support interposed between said first surface of the internal conductor and said bottom surface;
- a second insulator support for supporting said center area of the internal conductor on a side opposite to said first insulator support with said second insulator support attached to said second surface of the internal conductor; and
- an extension member contiguous to said second insulator support and extended along said wall surface towards said bottom surface.

13. A microwave circuit arrangement as claimed in claim 11, wherein said base plate has an opening for locating each of the at least one microwave connector assembly and a counterbore portion around said opening;
said conductive case having:
- a bottom portion for defining said bottom surface;
- a wall portion intersecting said bottom portion for defining said wall surface; and
- a flange portion extended from said wall portion in parallel to said bottom portion outside of said cavity, said flange portion being supported on said counterbore portion.

14. A microwave circuit arrangement as claimed in claim 13, wherein said conductive case has:
- a bottom portion for defining said base surface;
- a wall portion intersecting said bottom portion for defining said wall surface; and
- a spring member attached to said bottom portion.

* * * * *